(12) United States Patent
Ishiguro et al.

(10) Patent No.: US 8,964,460 B2
(45) Date of Patent: Feb. 24, 2015

(54) SEMICONDUCTOR DEVICE HAVING A NON-VOLATILE MEMORY BUILT-IN

(71) Applicant: Taiyo Yuden Co., Ltd., Tokyo (JP)

(72) Inventors: Takashi Ishiguro, Tokyo (JP); Kenichi Shimomai, Hyogo (JP); Kyoko Nakajima, Tokyo (JP); Tetsuo Hironaka, Hiroshima (JP); Kazuya Tanigawa, Hiroshima (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/114,889

(22) PCT Filed: Dec. 5, 2012

(86) PCT No.: PCT/JP2012/081569
§ 371 (c)(1),
(2) Date: Oct. 30, 2013

(87) PCT Pub. No.: WO2013/118378
PCT Pub. Date: Aug. 15, 2013

(65) Prior Publication Data
US 2014/0071749 A1    Mar. 13, 2014

(30) Foreign Application Priority Data
Feb. 8, 2012  (JP) .................................. 2012-025623

(51) Int. Cl.
*G11C 11/00* (2006.01)
*G11C 13/00* (2006.01)
(Continued)

(52) U.S. Cl.
CPC ........ *G11C 13/0069* (2013.01); *G11C 13/0004* (2013.01); *H01L 45/06* (2013.01); *H01L 45/144* (2013.01); *H01L 27/2436* (2013.01);
(Continued)

(58) Field of Classification Search
USPC ............. 365/46, 94, 100, 113, 129, 148, 158, 365/163; 257/2–5, 9, 296, 310, E21.35, 257/E31.047, E27.006; 438/29, 95, 96, 438/166, 135, 240, 259, 365, 482, 486, 597, 438/785; 977/754
See application file for complete search history.

(56) References Cited

U.S. PATENT DOCUMENTS

2003/0234449 A1   12/2003  Aratani et al.
2004/0179414 A1    9/2004  Hsu (Continued)

FOREIGN PATENT DOCUMENTS

JP   2004-6579 A    1/2004
JP   2004-273110 A  9/2004

(Continued)

OTHER PUBLICATIONS

Written Opinion (PCT/ISA/237) issued in PCT/JP2012/081569 mailed in Jan. 2013.

(Continued)

*Primary Examiner* — Harry W Byrne
(74) *Attorney, Agent, or Firm* — Chen Yoshimura LLP

(57) ABSTRACT

A semiconductor device of this invention has an array of non-volatile memory cells, may operate immediately after power activation to write data on and read out the data without reading from an external portion. Further, this invention is free from the lithographic process of the phase-change layer on the manufacturing process.

6 Claims, 22 Drawing Sheets

(51) Int. Cl.
*H01L 45/00* (2006.01)
*H01L 27/24* (2006.01)

(52) U.S. Cl.
CPC ........ *H01L27/2472* (2013.01); *G11C 2213/79* (2013.01); *G11C 2213/82* (2013.01); *Y10S 977/754* (2013.01)
USPC ............ 365/163; 365/148; 365/158; 977/754

(56) References Cited

U.S. PATENT DOCUMENTS

| | | | |
|---|---|---|---|
| 2004/0184331 A1* | 9/2004 | Hanzawa et al. | 365/203 |
| 2008/0149910 A1 | 6/2008 | An et al. | |
| 2009/0201752 A1* | 8/2009 | Riho et al. | 365/200 |
| 2009/0201753 A1* | 8/2009 | Riho et al. | 365/200 |
| 2009/0251941 A1 | 10/2009 | Saito | |
| 2010/0110767 A1* | 5/2010 | Katoh et al. | 365/148 |
| 2011/0205780 A1 | 8/2011 | Yasuda et al. | |

FOREIGN PATENT DOCUMENTS

| | | |
|---|---|---|
| JP | 2008-166771 A | 7/2008 |
| JP | 2009-194676 A | 8/2009 |
| JP | 2009-267384 A | 11/2009 |
| JP | 2011-172084 A | 9/2011 |

OTHER PUBLICATIONS

International Search Report (ISR) issued in PCT/JP2012/081569 mailed in Jan. 2013.

* cited by examiner

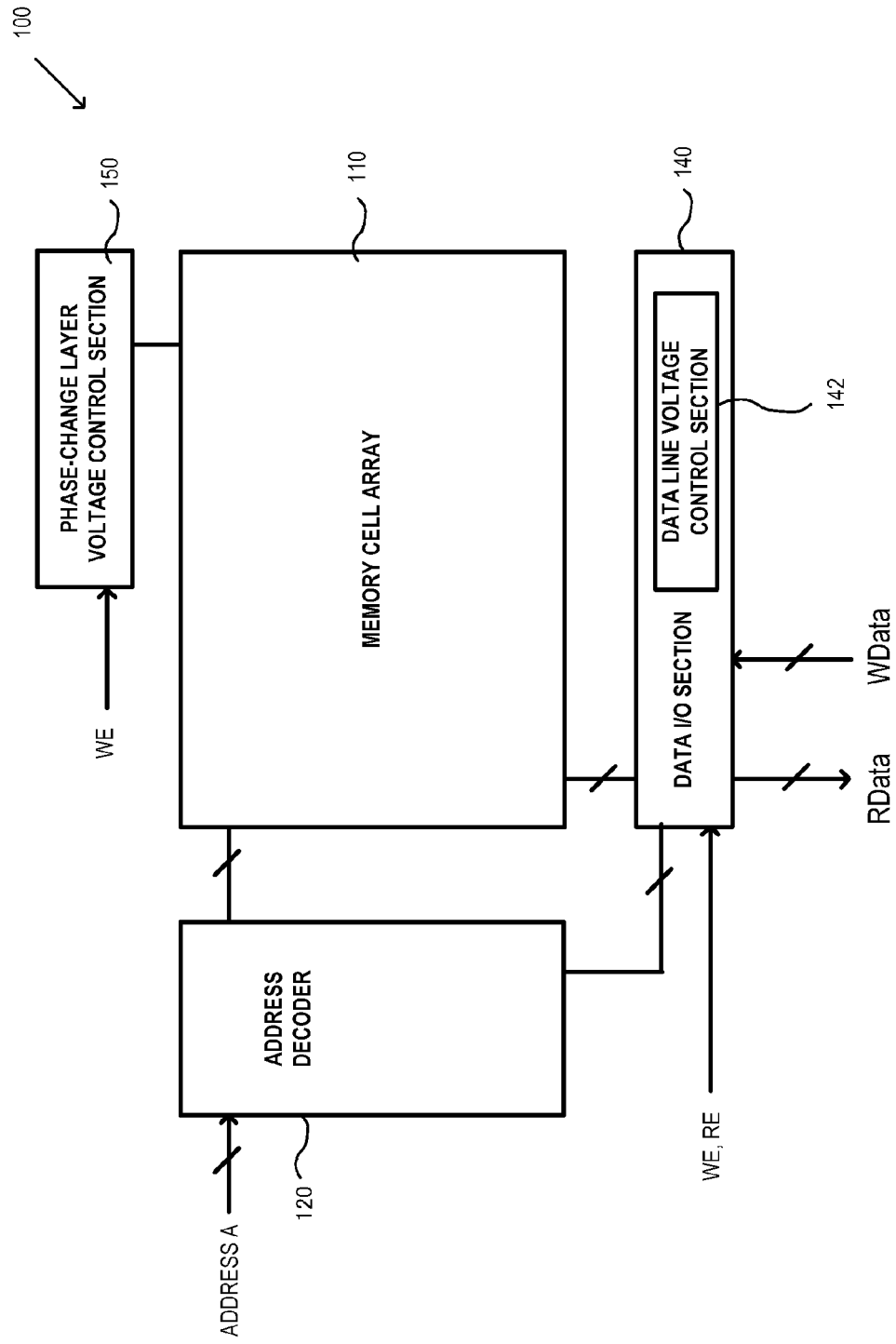

FIG.13

| A0 | A1 | A2 | A3 | D0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

FIG.15

| A0 | A1 | A2 | A3 | D0 | D1 | D2 | D3 |
|----|----|----|----|----|----|----|----|
| 0  | 0  | 0  | 0  | 0  | 0  | 0  | 0  |
| 1  | 0  | 0  | 0  | 0  | 1  | 0  | 0  |
| 0  | 1  | 0  | 0  | 0  | 0  | 1  | 0  |
| 1  | 1  | 0  | 0  | 0  | 1  | 1  | 0  |
| 0  | 0  | 1  | 0  | 0  | 0  | 0  | 1  |
| 1  | 0  | 1  | 0  | 0  | 1  | 0  | 1  |
| 0  | 1  | 1  | 0  | 0  | 0  | 1  | 1  |
| 1  | 1  | 1  | 0  | 0  | 1  | 1  | 1  |
| 0  | 0  | 0  | 1  | 1  | 0  | 0  | 0  |
| 1  | 0  | 0  | 1  | 1  | 1  | 0  | 0  |
| 0  | 1  | 0  | 1  | 1  | 0  | 1  | 0  |
| 1  | 1  | 0  | 1  | 1  | 1  | 1  | 0  |
| 0  | 0  | 1  | 1  | 1  | 0  | 0  | 1  |
| 1  | 0  | 1  | 1  | 1  | 1  | 0  | 1  |
| 0  | 1  | 1  | 1  | 1  | 0  | 1  | 1  |
| 1  | 1  | 1  | 1  | 1  | 1  | 1  | 1  |

FIG.18

| A0 | A1 | A2 | A3 | D0 | D1 | D2 | D3 |
|----|----|----|----|----|----|----|----|
| 0  | 0  | 0  | 0  | 0  | *  | 0  | *  |
| 1  | 0  | 0  | 0  | 0  | *  | 0  | *  |
| 0  | 1  | 0  | 0  | 0  | *  | 0  | *  |
| 1  | 1  | 0  | 0  | 1  | *  | 0  | *  |
| 0  | 0  | 1  | 0  | 0  | *  | 0  | *  |
| 1  | 0  | 1  | 0  | 0  | *  | 0  | *  |
| 0  | 1  | 1  | 0  | 0  | *  | 0  | *  |
| 1  | 1  | 1  | 0  | 0  | *  | 0  | *  |
| 0  | 0  | 0  | 1  | 0  | *  | 1  | *  |
| 1  | 0  | 0  | 1  | 0  | *  | 1  | *  |
| 0  | 1  | 0  | 1  | 0  | *  | 1  | *  |
| 1  | 1  | 0  | 1  | 1  | *  | 1  | *  |
| 0  | 0  | 1  | 1  | 0  | *  | 1  | *  |
| 1  | 0  | 1  | 1  | 0  | *  | 1  | *  |
| 0  | 1  | 1  | 1  | 0  | *  | 1  | *  |
| 1  | 1  | 1  | 1  | 0  | *  | 1  | *  |

SEMICONDUCTOR DEVICE HAVING A NON-VOLATILE MEMORY BUILT-IN

CROSS-REFERENCE TO RELATED APPLICATION

This application is based upon and claims the benefit of priority of the prior Japanese Patent Application No. 2012-025623, filed on Feb. 8, 2012, the entire contents of which are incorporated herein by reference.

FIELD

The present invention relates to a semiconductor device having a non-volatile memory built-in.

BACKGROUND

A programmable logic device (PLD), like FPGA (Field-Programmable Gate Array), is widely used as what can be reconfigured circuit configuration. Applicants or inventors have researched and developed "memory-based programmable logic device (MPLD)" (registered trademark) that realizes circuit configuration by using memory cell units. For example, the MPLD is described in Patent Document 1 below. The MPLD is constituted by MLUTs (Multi Look-Up-Table) that has all functions of memorize, LUT (Look-Up-Table), and switch. The MPLD realizes almost the same function of FPGA by being arrayed MLUTs which are mutually connected.

Further, the MPLD is different from FPGA which has switching circuits only for connecting memory cell units because the MPLD is a device whose a logic region and a connecting region have flexibility by using MLUTs as both a logic element and a connecting element.

Patent Document 1: Japanese Unexamined Patent Application Publication No. 2009-194676

Patent Document 2: Japanese Unexamined Patent Application Publication No. 2008-166771

SUMMARY

Memory cell units which are mounted on MLUT are configured by SRAM (Static Random Access Memory). Accordingly, the MPLD may not operate immediately because of operating after loading the information of circuit configuration from a non-volatile memory medium like outside ROM (Read Only Memory).

There is a memory cell unit using a non-volatile memory cell. A flash memory and a phase change memory (hereinafter "PRAM: Phase change Random Access Memory") are known as a non-volatile memory cell array (Patent Document 2). However, it is difficult to manufacture the flash memory on the standard CMOS process. Further, although there is a merit of high credibility by using the PRAM made of a phase-change layer like GST (Ge Sb Te) which prevents affects of cosmic rays and so on, the process of the PRAM requires a lithographic process of the phase-change layer which is more special than flash memory thereof.

A semiconductor device as one embodiment of this invention has an array of non-volatile memory cells, may operate immediately after power activation to write data on and read out the data without reading from an external portion. Further, the purpose of this invention is free from the lithographic process of the phase-change layer on the manufacturing process.

Illustrative embodiments resolving above problems are below.

(1) A semiconductor comprising:

An address decoder which decodes an address inputted from address lines, and outputs a word selection signal to a word line; and a memory cell array including a plurality of non-volatile memory cells, each of which being respectively disposed on crossing over points of each word lines and each data lines, the non-volatile memory cells which include a phase-change layer being partially used as a storage element and being connected to an electrode connected to a power-supply voltage at end;

a data line voltage control section which writes data on the non-volatile memory cells by decreasing a voltage of the data line being connected to the other end of the phase-change layer and causing partially a phase change in the phase-change layer.

The lithography of phase-change layer is not required because the phase-change layer is partially used as storage element.

(2) The semiconductor device according to (1), further including a sheet of electrode which provides the power-supply voltage disposed above the phase-change layer, wherein the word line, the data line, and the data line voltage control section are disposed under the phase-change layer. The semiconductor device may be manufactured by simplified process.

(3) The semiconductor device according to (1) or (2), further including a phase-change layer voltage control section applies a voltage which is higher than a reading out voltage to the storage element. A voltage of the data line is low in the timing of writing, so it may not apply a voltage in large excess to write.

(4) The semiconductor device according to any one of (1)-(3), wherein the non-volatile memory cells include a CMOS inverter sensing an electrical potential read out from the storage element or a MOS transistor accommodating a conductance of the electrical potential.

It may avoid a variation in the electrical potential readout caused from a production tolerance of the phase-change layer.

(5) The semiconductor device according to any one of (1)-(3), wherein the non-volatile memory cells include one n MOS transistor and a MOS transistor accommodating a conductance of the electrical potential read out and being located outside of the memory cell array. The n MOS transistor may make smaller a dimension of the memory cell array. The MOS transistor may avoid a variation in the electrical potential read out caused from a production tolerance of the phase-change layer.

(6) The semiconductor device according to any one of (1)-(5), further including a plurality of logic blocks having a plurality of the memory cell arrays respectively, wherein the logic block operates as a logic element or a connection element when a data of a table of truth value being written on the memory cell array. The semiconductor device may be utilized as the MPLD.

(7) The semiconductor device according to any one of (1)-(6), wherein the number of the address lines and the data lines are N (N is an integer equal to 2 or more) of them respectively, wherein the N address lines of the logic block are respectively connected to the each data line of N other logic blocks, wherein the N the data lines of the logic block are respectively connected to the each address line of N other storage block of the logic block.

A semiconductor device as one embodiment of this invention has an array of non-volatile memory cells, may be operated immediately after power activation to write data and read out the data without reading from an external portion. Further, this invention may be free from the lithographic process of the phase-change layer on the manufacturing process.

BRIEF DESCRIPTION OF DRAWINGS

FIG. 2 is a view showing one example of a semiconductor device.

FIG. 13 is a view showing a truth table of the logic circuit of FIG. 12.

FIG. 15 is a view showing a truth table of the connection element of FIG. 14

FIG. 18 is a view showing a truth table of the logic element and the connection element of FIG. 17

DESCRIPTION OF EMBODIMENTS

Hereinbelow, with reference to drawings, details of embodiments will be described in the order of [1] the semiconductor device, [2] a detail of the MPLD, [3] the detail of the MPLD.

[1] The Semiconductor Device

Figure 1A:
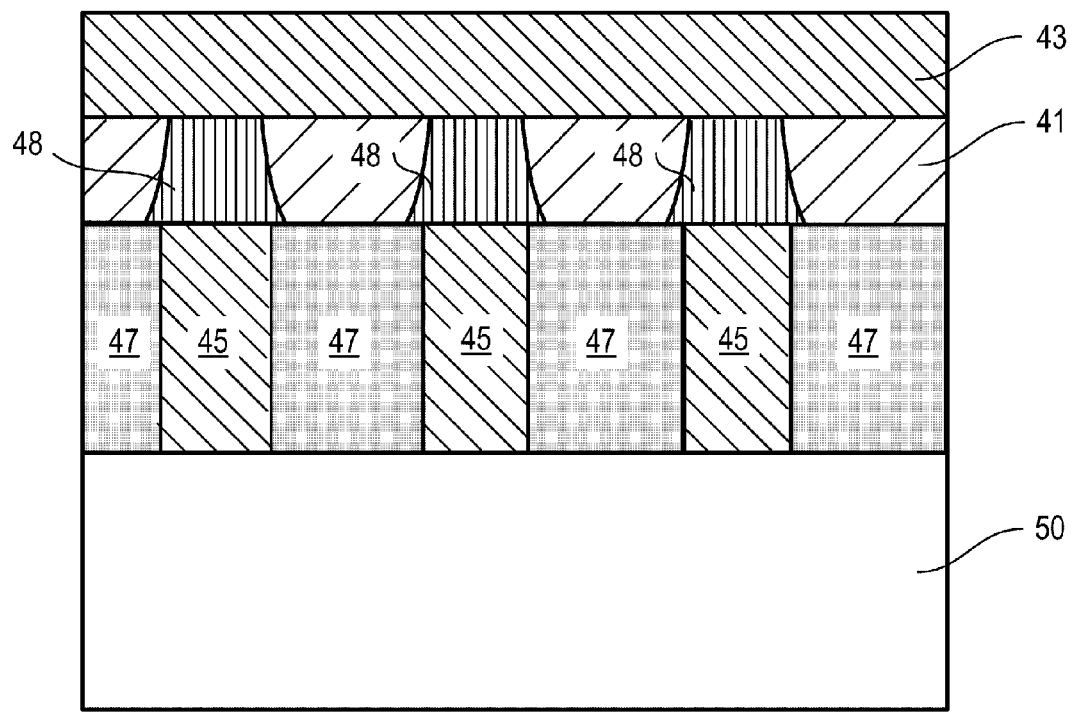
FIG. 1A is a cross-sectional view of a memory cell of one embodiment of this invention.

FIG. 1A is a cross-sectional view of a memory cell of one embodiment of this invention. A storage element of the memory cell is configured by a phase-change layer 41. The phase-change layer 41 is comprised of a compound thin film which is germanium, antimony, and tellurium (here in after "GST"). Note that the phase-change layer 41 is called "GST" below. An upper electrode 43 is located on an upper surface of the phase-change layer 41. A lower electrode 45 and an insulation layer 47 are located on an under surface of the phase-change layer 41. The upper electrode 43 is formed of, for example, aluminum. The insulation layer 47 is formed of, for example, silica dioxide. The lower electrode 45 is a penetrating electrode and formed of, for example, Ti/TiNx/Al. Further, a semiconductor circuit layer 50 is located under the lower electrode 45. A phase of the phase-change layer 41 is changed to the crystalline state or the amorphous state by applying electrical current between the upper electrode 43 and the lower electrode 45. Then, a resistance of the phase-change layer 41 is changed. The phase of the phase-change layer 41 transforms to the amorphous state (high-value resistance) when the phase-change layer 41 is rapidly cooled after heating more than melting temperature of the phase-change layer 41. The phase of the phase-change layer 41 transforms to the crystalline state (low-value resistance) when the phase-change layer 41 is slowly cooled after heating more than a certain level of temperature. The phase-change layer 41 may keep memory as the storage element of the memory cell because a state of the electrical potential, at the time of reading out, which is resulted from the difference of the resistance is matched to a signal of 0/1. In FIG. 1, the upper electrode 43 and the phase-change layer 41 cover a whole area of a chip except a portion of an external electrode and are not patterned.

A phase-change region 48 is a region whose phase changes from amorphous to crystalline state. The phase-change layer 41 located above the insulation layer 47 prevents from shorting the phase-change regions 48 each other because an initial state of the phase-change layer 41 is amorphous state which is high-value resistance. The phase-change layer 41 is partially used as the storage element of the memory cell. Conventionally, the PRAM is realized by a configuration which insulatively protects a phase changeable material. On this embodiment, however, the phase changeable material of the phase-change layer 41 does not need to be protected insulatively so that the manufacture process may be planed simplification.

Figure 1B:
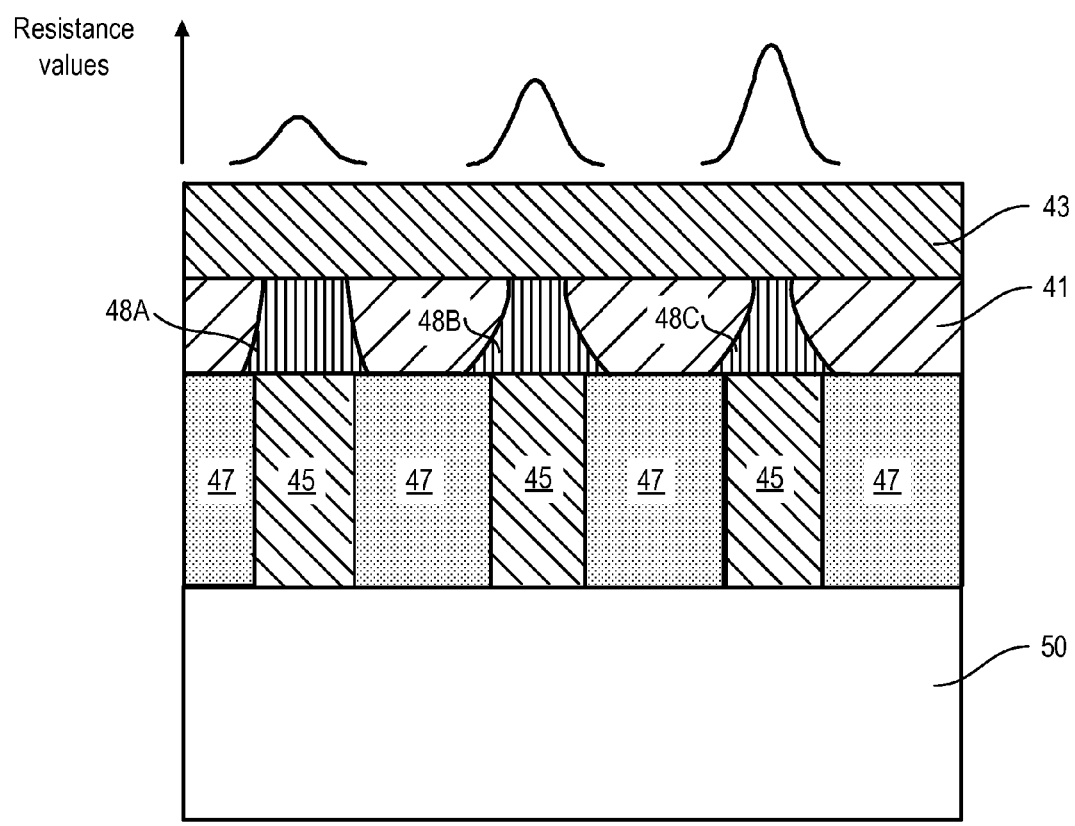
FIG. 1B is a view showing one example of a variation in resistance values of the phase-change layers.

FIG. 1B is a view showing one example of a variation in resistance values of the phase-change layers. On this configuration, the phase-change layer 41 is not patterned, so the phase-change regions 48A to 48C have different sizes depended on and resulted from voltage applied between the upper electrode 43 and the lower electrode 45. As a result, the variation in resistance values of the phase-change layer 41 arises.

As illustrated in FIG. 1B, on one side film formation, there is possibility that a designed circuit reading out on a certain set point of a high or low value resistance does not work properly, because the size of the phase-change region 48 is changed by applied voltage so that the resistance-values of phase-change have the variation. Further, because of this structure, in order to obtain a heat for phase-change, a certain set point of write-in voltage (Vdd_W) is required. At the time of reading out, a read-out voltage (Vdd_R) which does not take place the phase-change must be used. The semiconductor device is designed under above restrictions.

FIG. 2 is a view showing one example of a semiconductor device. The semiconductor device 100 as showed FIG. 2 comprises a memory cell array 110 including memory cells which memorize data respectively, an address decoder 120, and a section of data I/O 140 reading data from or writing data to the memory cell array 110.

The memory cell array 110 includes m×2m number of memory cells (the storage element that goes along with), m×2n number of memory cells are located on interfaces between 2n number of word lines and m number of data lines (also called "bit line", the same shall apply hereinafter).

The address decoder 120 decodes address signals which are received from n number of address signal lines, and outputs word line selection signals which are decode signals and data line selection signals which select in the section of data I/O 140 to 2n number of word lines WL, and realizes a processing reading data from or writing data to the correspondent memory cells.

A data line voltage control section 142 reduces an electrical potential of the correspondence data line after receiving the data line selection signal outputted from the address decoder 120 and a rising edge timing of, for example, Write Enable (WE) from an external portion.

Decreasing voltage of the data line, consequently, the phase-change layer 41 to be applied a sufficient voltage to change phase.

The section of data I/O 140 passes a signal level of the write-in data on m number of data lines b, /b when receiving the rising edge timing of, for example, Write Enable (WE) from an external portion. Then, the section of data I/O 140 writes data to the memory cell. Further, the section of data I/O 140 outputs a read-out data along with outputting a signal level of m number of data lines b, /b when receiving the rising edge timing of Write Enable (WE) from the external portion.

A phase-change layer voltage control section 150 changes a providing voltage for the phase-change layer 41 to the write-in voltage (Vdd_W) when receiving the rising edge timing of Write Enable (WE) from the external portion and then, stops providing the write-in voltage at the rising edge timing of Write Enable. Further, the phase-change layer voltage control section 150 changes the providing voltage for the phase-change layer 41 to the read-out voltage (Vdd_R) when receiving the edge timing of Read Enable (RE) from the external portion and then, stops providing the read-out voltage at the rising edge timing of Write Enable. Further, there are the data line voltage control section 142 which comprises two inverters and the phase-change layer voltage control section 150 as peripheral circuit.

[1.1] A Circuit Configuration of 5 Transistors Memory Cell

Figure 3:
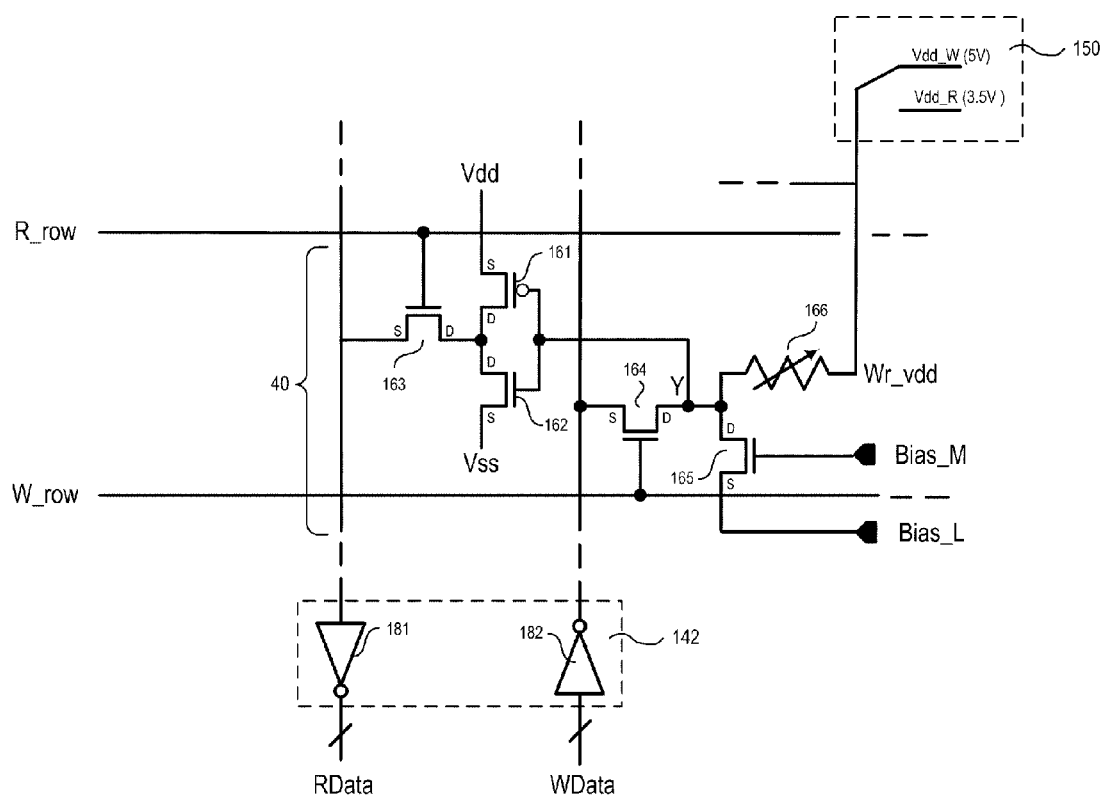
FIG. 3 is a view showing a first example of a memory cell circuit of one embodiment of this invention.

FIG. 3 is a view showing a first example of a memory cell circuit of one embodiment of this invention. A memory cell 40 shown in FIG. 3, comprises 5 number of transistors and GST, concretely, one pMOS (positive Channel Metal Oxide Semiconductor) transistor 161, 4 number of nMOS (negative Channel Metal Oxide Semiconductor) transistors 162~165, and a GST 166 which is a resistor composed of apart of the phase-change layer 41. The GSTs 166 can be mutually connected each other in case of being arrayed.

The GST 166 is a part of the phase-change layer 41. In short, it is composed of phase-change layer 41 which is located above the lower electrode 45 shown FIG. 1. The GST 166 operates as the storage element memorizing a state of "0" or "1" when the phase-change layer 41 changes its phase to crystalline or amorphous state to change its own resistance.

A souse of the pMOS 161 is connected to VDD (power-supply voltage). A souse of the nMOS 162 is connected to VSS (ground voltage). The pMOS 161 and the nMOS 162 operate as a CMOS (Complementary Metal Oxide Semiconductor) inverter to connect their drains respectively. The CMOS inverter senses a level of signal outputted in accordance with a state memorized in the GST 166, and outputs to a read-out data line RData through the nMOS transistor 163.

A gate of the nMOS transistor 163 is connected to a read-out word line R_row. The nMOS transistor 163 outputs a state signal of the GST 166 being sensed by the CMOS inverter after applying a signal from the read-out word line R_row to the gate of the nMOS transistor 163. As described above, a variation of initial resistance values can occur in the manufacturing process of one side film formation. A gate of the nMOS transistor 165 is connected to the GST 166. A souse of the nMOS transistor 165 is connected to a low bias Bias_L. A variation of resistance values of the GST 166 on an operation of reading out is reduced because of a conductance being matched as a result of applying a middle bias Bias_M voltage Vdd_M to the gate of the nMOS transistor 165. And, an output of the state signal of the GST 166 is sensed by the CMOS inverter, and then, a voltage is amplified.

Further, the low bias Bias_L is a voltage in order to accord a center value of a voltage division with a threshold of the CMOS inverter comprising the pMOS 161 and the nMOS 162 as a result of raising a division voltage when a voltage of the nMOS transistor 165 of the GST 166 is divided.

The data line voltage control section 142 which is a peripheral circuit, comprises two inverters 181, 182 which reverse input and output, and is located on the line of a write-in data line WData and/or a read-out data line RData. In the time of a write-in process, the inverter makes the write-in data WData into a reversed signal /WData. Then, the inverter makes VSS when the write-in data WData is "1". Then, the write-in process to the GST 166 is performed. In this way, a voltage of selected write-in data line WData is lowered to the VSS at the time of the write-in process.

A phase-change layer voltage control section 150 is connected to all of the GST 166 within memory cell units. In the time of the write-in process, the phase-change layer voltage control section 150 changes a supply voltage (Wr_vdd) for all of the GST 166 within memory cell units to a write-in voltage (Vdd_W). In the time of the read-out process, the phase-change layer voltage control section 150 changes the supply voltage for the GST 166 to a read-out voltage (Vdd_R).

A voltage of the write-in data line WData is lowered by the data line voltage control section 142 at the time of the write-in process. A gate of a nMOS transistor 164 is connected to a write-in word line W_row. When a signal from the write-in word line W_row is applied to the gate of the nMOS transistor 164, the write-in data line WData and GST 166 are electrically connected each other. In the write-in process, the GST 166 is applied a voltage from which the phase-change because the GST 166 is applied the write-in voltage (Vdd_W) which is higher than the read-out voltage (Vdd_R) at the same time that a voltage of the write-in data line WData is lowering.

[1.2] Memory Operation of 5 Transistor Memory Cells

Figure 4:
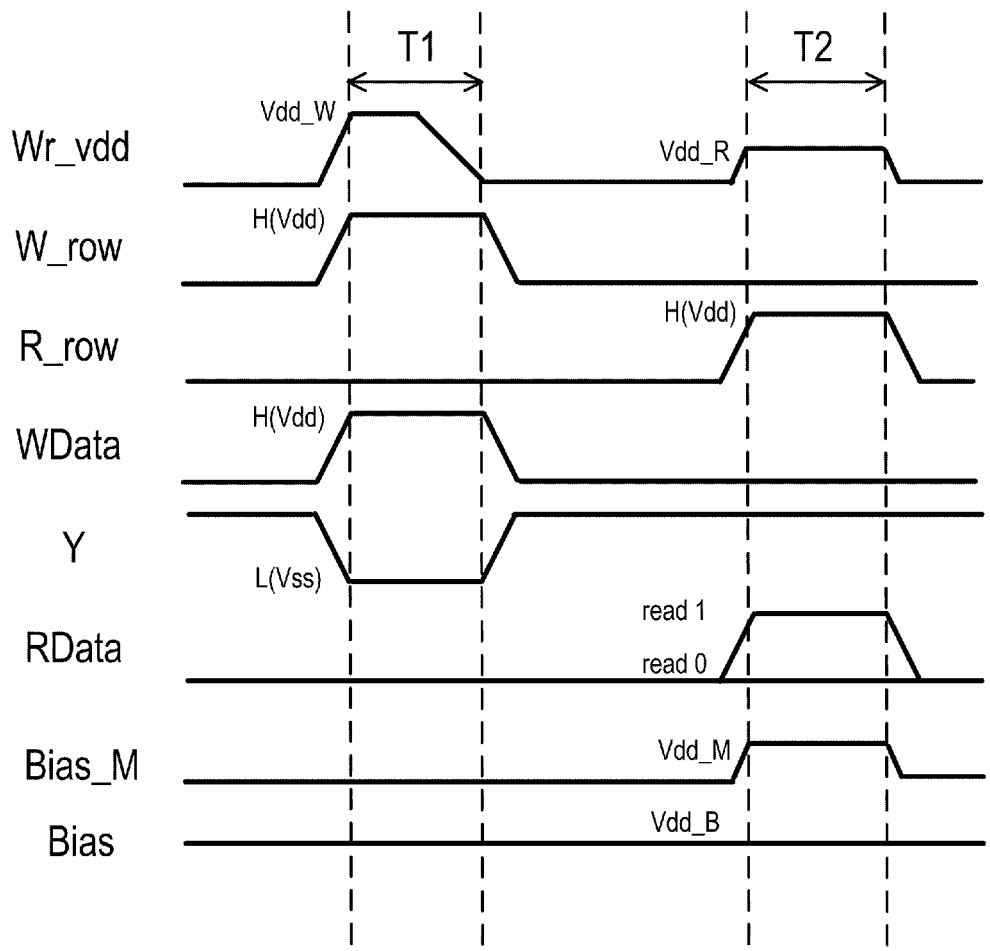
FIG. 4 is a view showing a wave pattern of memory movement of the memory cell circuit of FIG. 3.

FIG. 4 is a view showing a wave pattern of memory movement of the memory cell circuit of FIG. 3. In the write-in process indicated by T1, first, the write-in word line W_row and the write-in data line WData are respectively set on "1" (H (Vdd)). Then, "1" being set in the write-in data line WData is flipped by the inverter, and becomes "0" at point Y. At this time a difference of voltages between the ends of the GST 166 arises when the write-in voltage Vdd_W is applied from a line of Wr_vdd. Then, the write-in process is performed by phase-change arising in proportion as lowering the difference of voltages.

In the read-out process indicated by T2, first, a line of Bias_M and a line of Bias are respectively set on a voltage Vdd_M and a voltage Vdd_b. The read-out word line R_row is also set on "1". And the voltage Vdd_R is applied to a line of Wr_vdd. Then, a divided voltage according to the resistance value of the GST 166 arises because the Vdd_R is divided into the GST 166 and the nMOS transistor 165. The read-out process is performed by sensing the divided voltage with the inverter located in the cell, filliping the divided voltage with the inverter located outside the cell, and outputting the divided voltage to the line of RData. In other word, a current which flows from the line of Wr_vdd to the line of Bias_L is divided into phase-change layer (GST 166) and nMOS transistor 165, then, the divided voltage is sensed by the CMOS inverter, and outputted to read-out data line RData. In case of coming up variations of resistance values in each phase of phase-change layer, the variations can be addressed because the voltage Vdd_M which is applied to the line of Bias_M can adjust the conductance of the nMOS transistor 165.

[1.3] A Circuit Configuration of 1 Transistor Memory Cell

Figure 5:
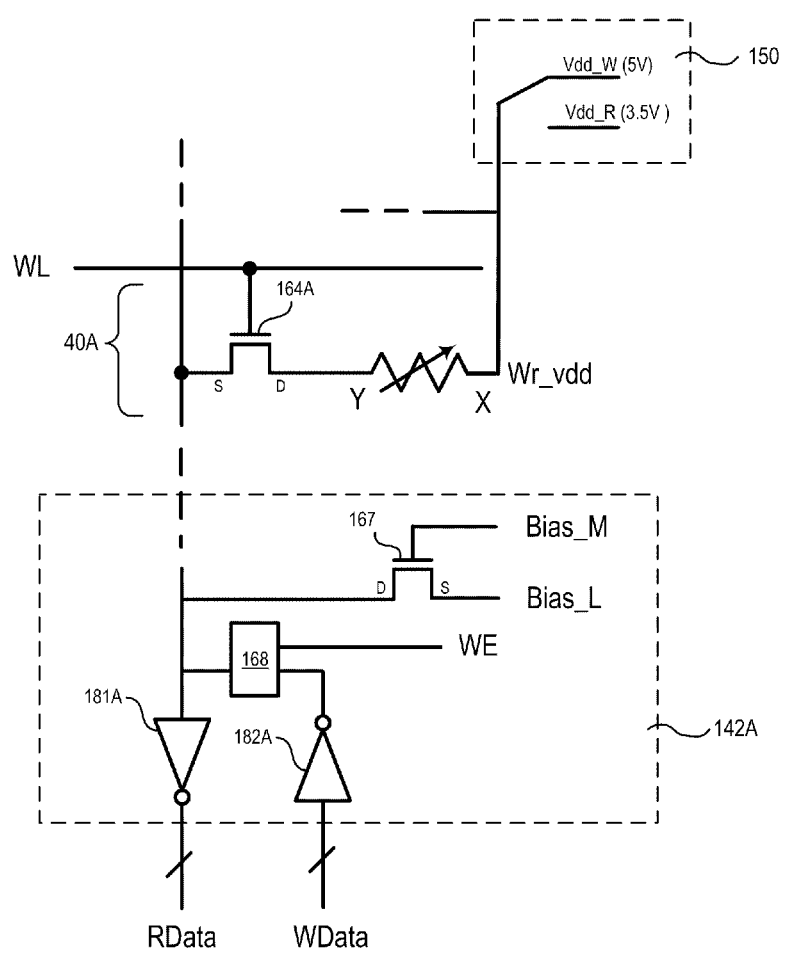
FIG. 5 is a view showing a second example of a memory cell circuit of one embodiment of this invention.

FIG. 5 is a view showing a second example of a memory cell circuit of one embodiment of this invention. A memory cell 40A shown in FIG. 5 comprises one nMOS transistor 164B and the GST 166 comprising apart of the phase-change layer 41. Further, there are a data line voltage control section 142A comprising two inverters 181A, 182A, a nMOS transistor 167, and a CMOS 168 and the phase-change layer voltage control section 150 as peripheral circuit. An operation of the phase-change layer voltage control section 150 is a same operation above described with FIG. 3 and FIG. 4.

The memory cell 40A comprising one nMOS transistor 164B and the GST 166, is configured in the same manner of the memory cell 40 that the GST may be mutually connected each other. And the circuit 40A and memory cell 40 have large cell dimensions because of using pMOS. Thus, the circuit 40A and memory cell 40 can be decreased the cell dimensions by replacing pMOS with nMOS. Because of this, different peripheral circuit 142A is disposed. The data line voltage control section 142A, as peripheral circuit, comprises CMOS switch 168 which is controlled to write-in by two inverters 181A, 182A reversing input and output, and also, nMOS transistor 167 used in operating of reading-out.

A gate of nMOS transistor 164A connects word line WL. The nMOS transistor 164A outputs the state signal of the GST 166 when the gate of nMOS transistor 164A is applied a signal from read-out word line WL. As described above, on one side film formation, there is possibility that the variation of initial resistance-values on manufacturing process. A gate of the nMOS transistor 167 which is one element of the data line voltage control section 142A which is peripheral circuit connects a line of Read_bias. A source of the nMOS transistor 167 connects Bias. The variation of resistance-values of the GST 166 in operating of reading-out is reduced by adjusting conductance by applying a voltage of the line of Read_bias Vdd_M to the gate of the nMOS transistor 167.

[1.4] Memory Operation of 1 Transistor Memory Cell

Figure 6:
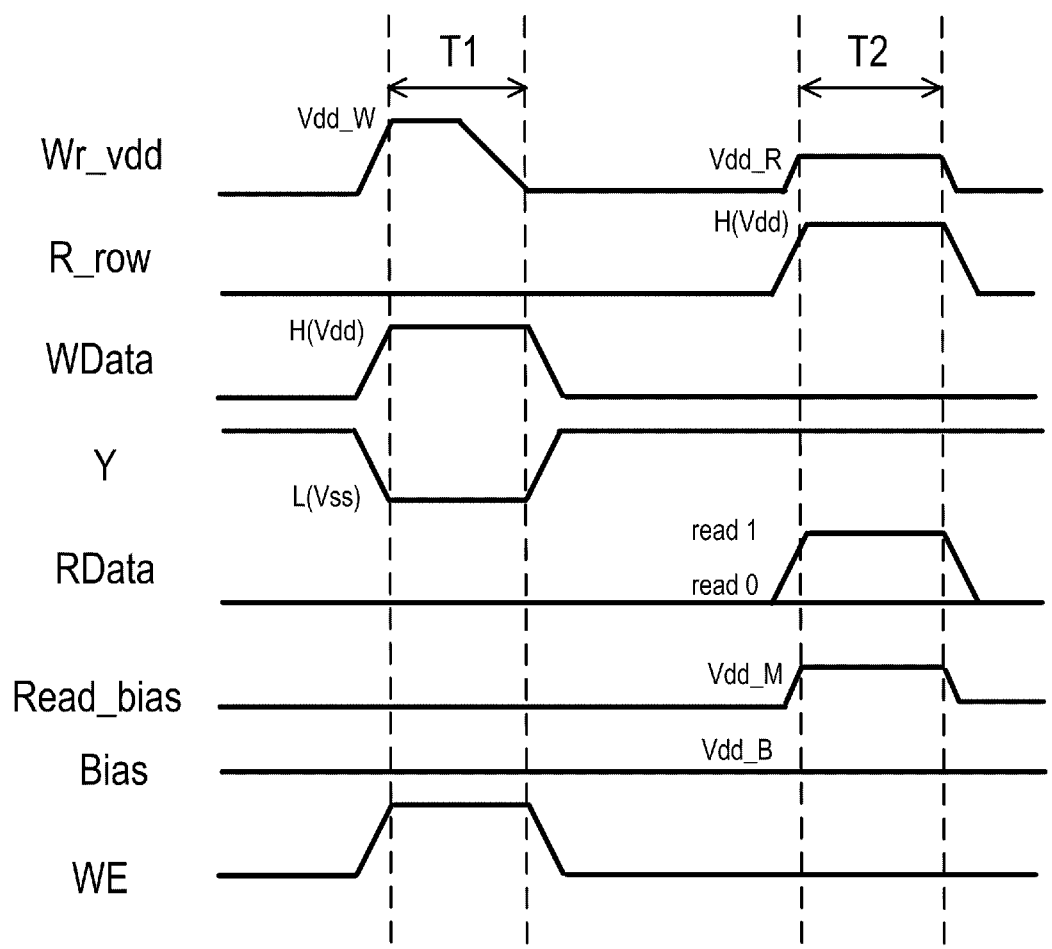
FIG. 6 is a view showing a wave pattern of memory movement of the memory cell circuit of FIG. 5.

FIG. 6 is a view showing a wave pattern of memory movement of the memory cell circuit of FIG. 5. In case of not being especially noted, rising wave patterns indicate signal "1" and a lowering wave pattern indicates signal "0". And, the state of high resistance of the GST corresponds to signal "1". The state of low resistance of the GST corresponds to signal "0". And, an initial resistance value of the GST is the state of high resistance.

In the write-in process (T1), "1" is set in the write-in data line WData, a line of Write Enable (WE), and the word line WL. Then, "1" which is one set in the write-in data line WData is reversed by inverter, makes point Y "0" through the intermediary of the CMOS switch 168 turned ON and the nMOS transistor 167. At this time a voltage difference is generated at each end (point X, point Y) of the GST 166 when the write-in voltage (Vdd_W) applied from a line of Wr_vdd. And then, write-in process is performed by phase-change arising as a result of gradually lowering Vdd_W.

In the read-out process (T2), firstly, the line of Read_bias is set in voltage Vdd_M. And, the word line WL set to "1". Also, the read-out voltage Vdd_R is applied to the line of Wr_vdd. Then, the voltage Vdd_R is divided in the GST 166 and the nMOS transistor 167, and divided voltage according to the resistance value of the GST 166 is generated. The read-out process is performed by outputting the divided voltage which is sensed by inverter located on the out of cell to the read-out data line RData.

Figure 7:
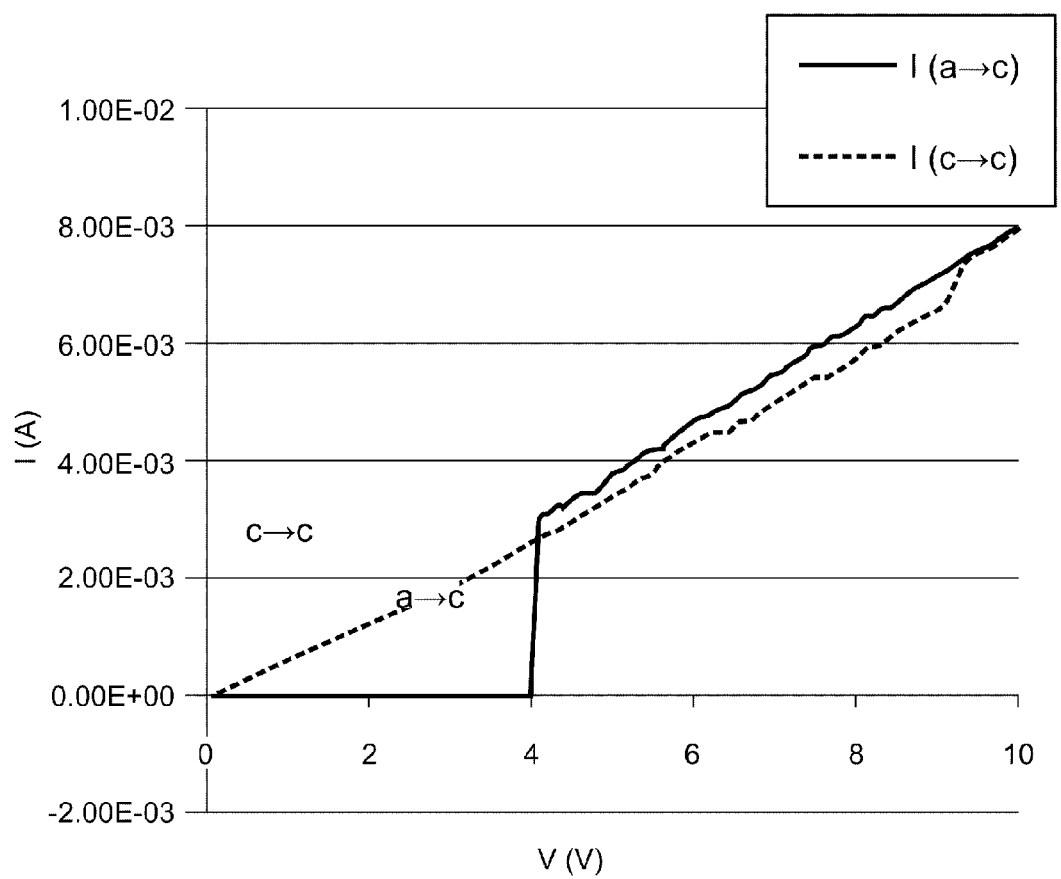
FIG. 7 is a view showing a characteristic of IV at the time of writing on and reading out from the storage element.
Figure 8:
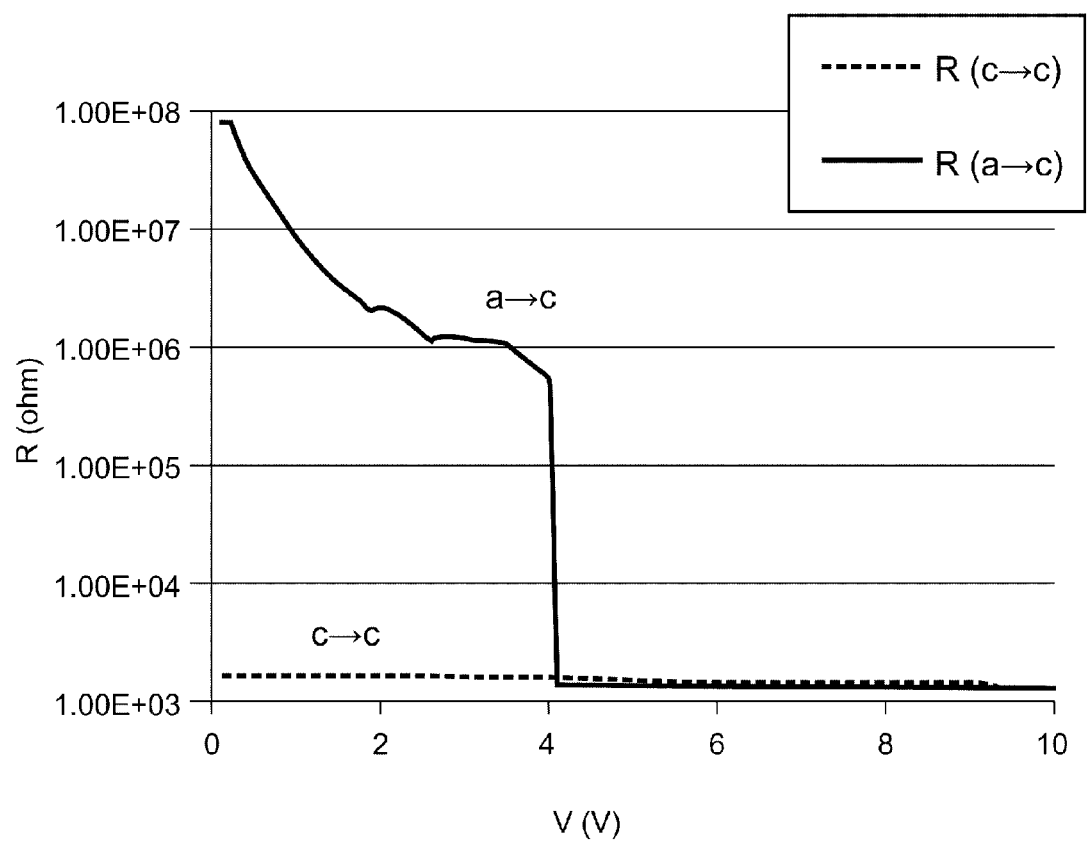
FIG. 8 is a view showing a change of resistance at the time of writing on and reading out from the storage element.

FIG. 7 is a view showing a characteristic of IV at the time of writing on and reading out from the storage element. And FIG. 8 is a view showing a change of resistance at the time of writing on and reading out from the storage element. "a→c" indicates the time of writing-in. "c→c" indicates the time of read-out. Also, the characteristic of IV and the change of resistance depend on a size of bias of the lower electrode 45 and a thickness of the phase-change layer 41. For example, the high resistance of amorphous phase becomes small when the size of bias is bigger or the thickness is thinner. Also, the low resistance value of the state of crystalline depends on the compliance current value of transistor.

The semiconductor device 100 described above, can be used as MLUT 30 which is described below. From this, the data memorized in the MLUT 30 can be non-volatile so that it may operate immediately after power activation without reading a circuit configuration information from an external portion. Furthermore, the MLUT can be realized in simplified circuit configuration.

[2] Further Details about MPLD

Figure 9A:
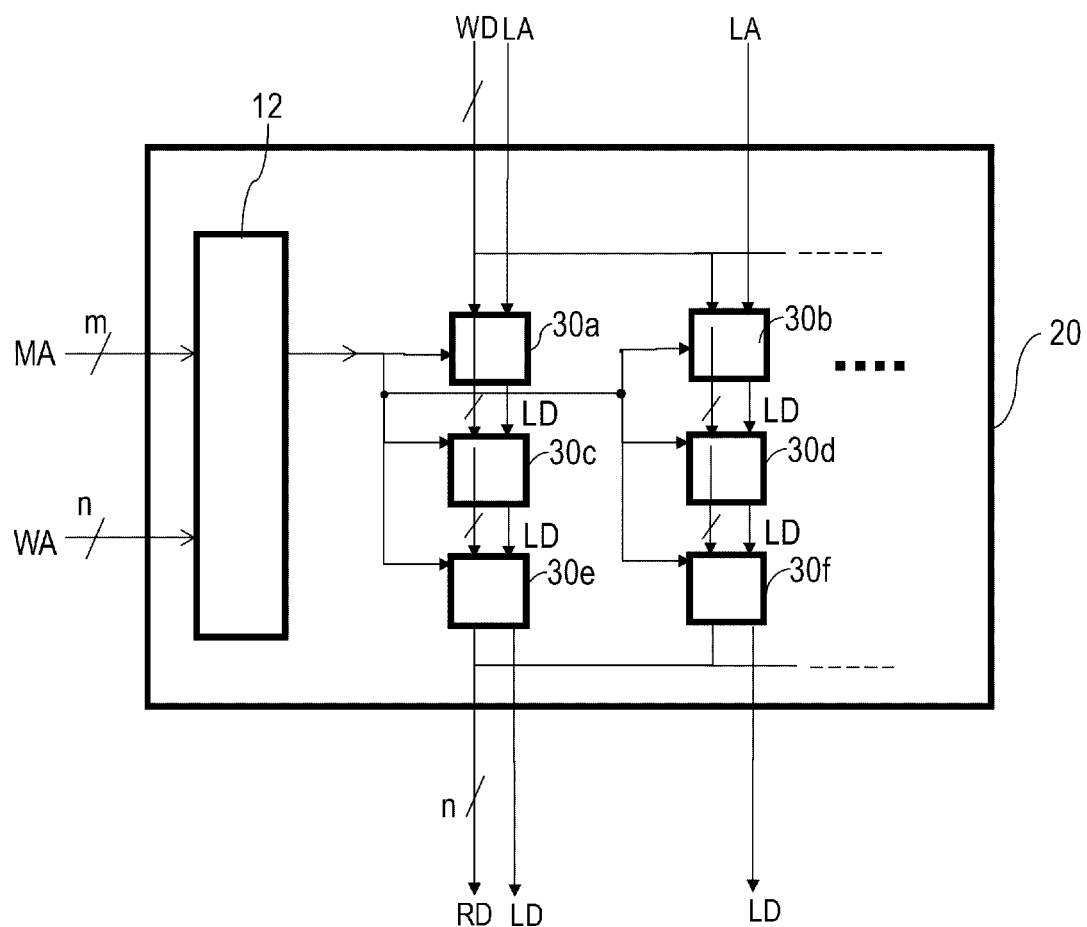
FIG. 9A is a view showing one example of MPLD.

FIG. 9A is a view showing detailed example of the MPLD. An element 20 shown in FIG. 9A is the MPLD as the semiconductor device. The MPLD 20 includes a plurality of the MLUT 30 as storage element blocks and a MLUT decoder 12. Further, the MPLD 20 operates as a logic section to be connected to an arithmetic processor, which will be described later.

The MPLD 20 includes a plurality of storage elements. Pieces of data which configure truth tables are respectively stored in the storage elements, which allows the MPLD 20 to perform a logic operation as a logic element, a connection element, or both of the logic element and the connection element.

The MPLD 20 further performs a memory operation. The memory operation is referred to as writing data into the storage elements included in the MLUT 30 and reading out the data. Accordingly, the MPLD 20 may operate as a main storage device or a cache memory.

When data is written into the MLUT 30, truth table data is rewritten. Accordingly, the memory operation causes reconfiguration of the truth table data. Note that among the reconfiguration, rewriting the truth table data stored in a specific single MLUT or a plurality of MLUTs in the MPLD, or a specific single storage element or a plurality of storage elements configuring the MLUT is referred to as "a partial reconfiguration".

[2.1] Memory Operation of MPLD

Figure 9B:
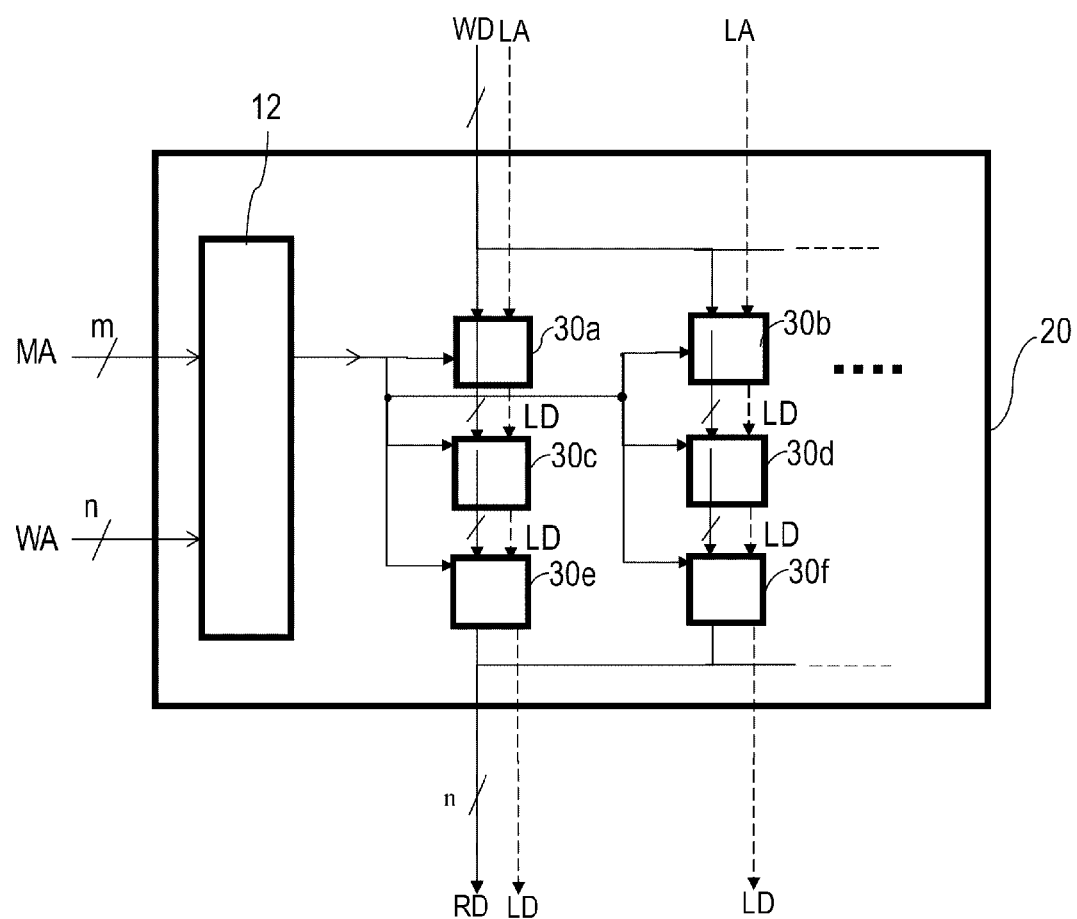
FIG. 9B is a view showing one example of a memory operation of the MPLD.

FIG. 9B is a view showing one example of the memory operation of the MPLD. In the memory operation, the MPLD 20 uses any signal of the memory operation address, the MLUT address, the write-in data WD and the read-out data RD, which are depicted in solid lines, and does not use the logic operation address LA and the logic operation data LD, which are depicted in dashed lines. Note that, for example, the memory operation address, the MLUT address and the write-in data WD are outputted by an arithmetic processor provided externally of the MPLD 20, and the read-out data RD is outputted to the arithmetic processor.

In the memory operation, the MPLD 20 receives the memory operation address and the MLUT address as addresses which specify the storage elements. The MPLD 20 receives the write-in data when writing in data, and outputs the read-out data RD when reading out data.

The MLUT address is an address which specifies a single MLUT included in the MPLD 20. The MLUT address is outputted to the MPLD 20 via l number of signal lines. Note that l is the number of selection address signal lines which specify the MLUT. The l number of signal lines may specify l-th power of 2 number of MLUT(s). The MLUT decoder 12 receives the MLUT address via the l number of signal lines, decodes the MLUT address, selects and specifies the MLUT 30 to be the target of the memory operation. The memory operation address is decoded by an address decoder which will be described later using FIG. 11, via the l number of signal lines, and selects a memory cell which is to be the target of the memory operation.

Note that the MPLD 20, for example, receives the MLUT address, the write-in data and the read-out data all via n number of signal lines. Here, n is the number of selection address lines for the memory operation or the logic operation of the MLUT, which will be described later with reference to FIG. 10. MPLD 20 supplies the MLUT address, the write-in data and the read-out data to each MLUT via the n number of signal lines.

[2.2] Logic Operation of MPLD

Figure 9C:
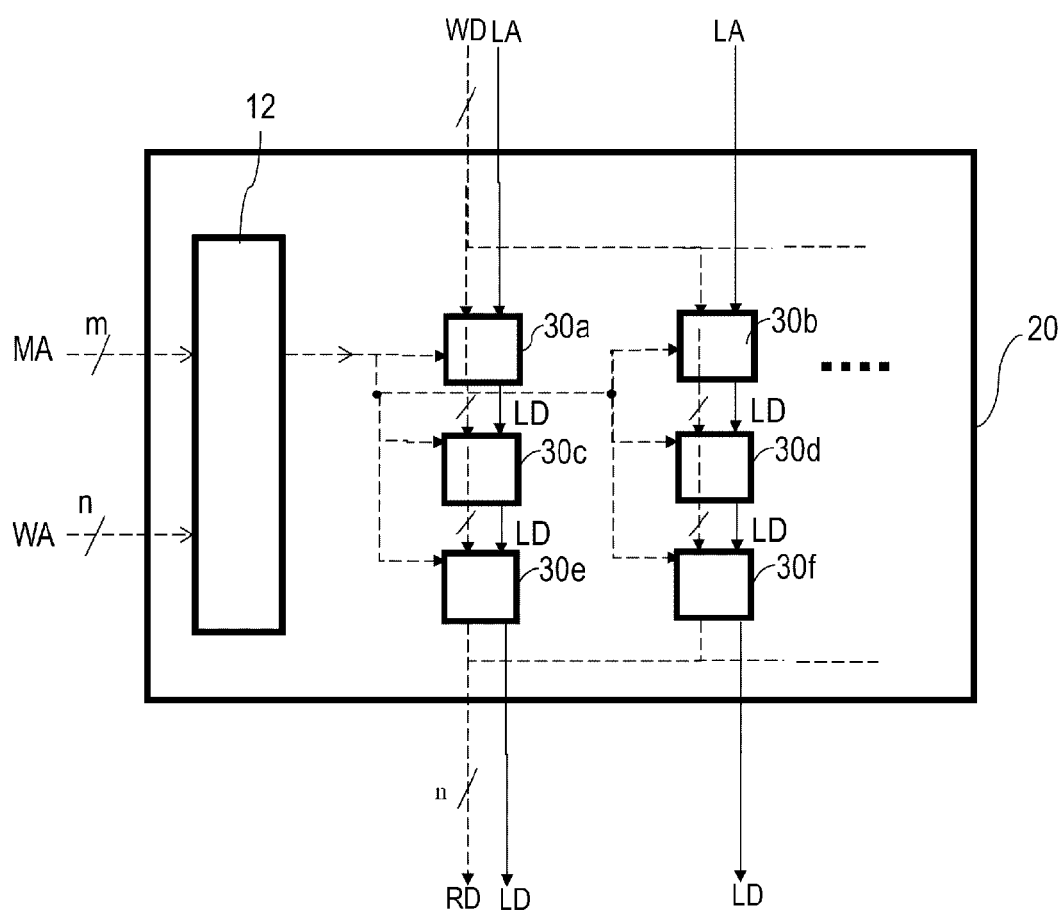
FIG. 9C is a view showing one example of a logic operation of the MLUT.

FIG. 9C is a view showing one example of a logic operation of the MPLD 20. In the logic operation of MPLD 20, the logic operation address and the logic operation data which are shown in solid lines in FIG. 9C are used.

In the logic operation of MPLD 20, the logic operation address is outputted from an external device, and is used as an input signal of a logic circuit configured by a truth table of the MLUT 30. Further, the logic operation data signal is an output signal of the logic circuit, and is outputted to an external device as the output signal of the logic circuit.

Among the plurality of MLUTs, an MLUT arranged in the periphery of the MPLD 20 operates as the MLUT which receives the logic operation address LA which is the logic operation data, and outputs the logic operation data LD to and from a device externally arranged of the MPLD 20. For example, the MLUTs 30a, 30b shown in FIG. 9A receive the logic operation address LA from outside of the semiconductor device 100, and outputs the logic operation data LD to the surrounding another MLUT 30d. Further, the MLUTs 30e, 30f receive the logic operation address LA from other MLUTs 30c, 30d, and output the logic operation data LD to outside of the MPLD 20.

The address line of the logic operation address LA of the MLUT is connected to a data line of the logic operation data LD of an adjacent MLUT. For example, the MLUT 30c receives the logic operation data outputted from the MLUT 30a as the logic operation address. Therefore, the logic operation address and the logic operation data of the MLUT is different from an MLUT address in which each MLUT is individually connected to each other, in that they may be obtained by an input or an output of the surrounding MLUTs.

The logic of the logic operation of the MPLD 20 may be realized by the truth table data stored in the MLUT 30. Some of the MLUTs 30 operate as a logic element of a combination circuit of AND circuit, an adder, and the like. The other MLUTs operate as a connection element which connects the MLUTs 30 there between realizing the combination circuit. Rewriting of the truth table data to realize the logic element and the connection element is performed by the reconfiguration of the above described memory operation.

[3] Further Details about MLUT

Figure 10:
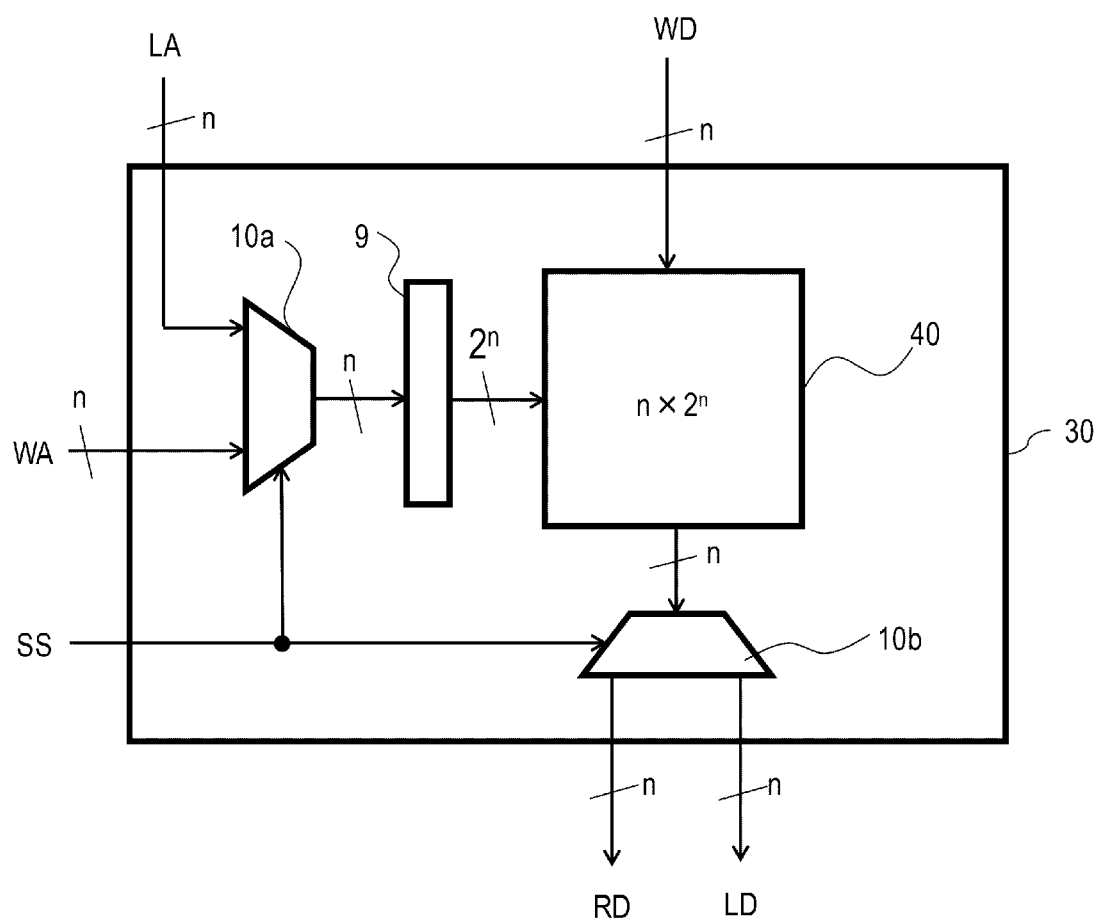
FIG. 10 is a view showing one example of the MLUT.

Herein below, the MLUT is described. FIG. 10 is a view showing the first example of the MLUT. The MLUT 30 shown in FIG. 10 includes an address switching circuit 10a, an address decoder 9, a storage element 40 and an output data switching circuit 10b. The MLUT 30 shown in FIG. 10 operates to output the logic operation data in accordance with the logic operation address, when the operation switching signal shows logic operation. Further, the MLUT 30 operates to receive the write-in data or output read-out data in accordance with the memory operation address, when the operation switching signal shows memory operation.

The address switching circuit 10a connects n number of memory operation address signal lines into which the memory operation address is inputted, n number of logic operation address input signal lines into which the logic operation address signal is inputted, and the operation switching signal lines into which the operation switching signal is inputted. The address switching circuit 10a operates to output either the memory operation address or the logic operation address to the n number of selection address signal lines based on the operation switching signal. The reason why the address switching circuit 10a selects the address signal lines is because the storage element 40 is a 1-port storage element which receives either the reading-out operation or the writing-in operation.

The address decoder 9 decodes the selection address signal received from the n number of address signal lines supplied from the address switching circuit 10a, and outputs a decode signal to n-th power of 2 number of word lines.

The n×2n number of storage elements are arranged in the connected portions of the n-th power of 2 number of word lines, n number of write-in data lines, and n number of output data lines.

When signals from the n number of output data lines are received, the output data switching circuit 10b operates to output a read out data to the n number of read-out data signal lines, or output the read out data to the logic operation signal lines, in accordance with the inputted operation switching signal.

[3.1] Logic Operation of MLUT

A. Logic Element

Figure 11:
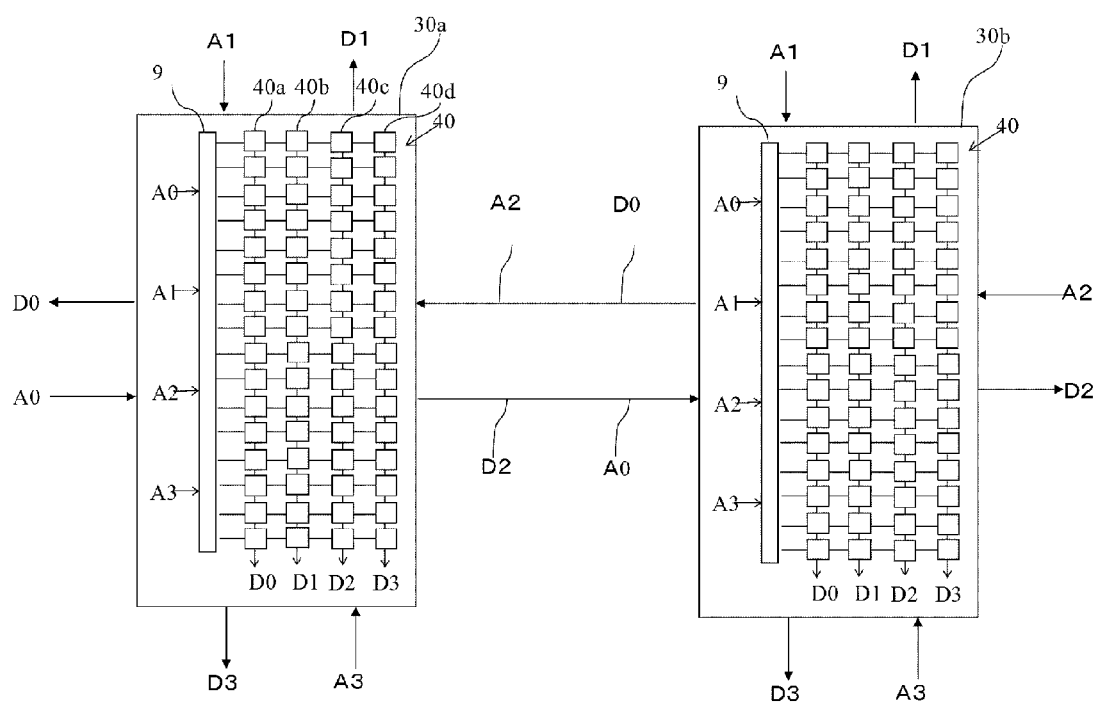
FIG. 11 is a view showing one example of the MLUT which operates as a logic element.

FIG. 11 is a view showing one example of the MLUT which operates as a logic element. The MLUT shown in FIG. 11 is similar to MLUT shown in FIG. 10 or semiconductor devices shown in FIG. 1, FIG. 4, or FIG. 7 as a circuit. The address switching circuit 10a and the output data switching circuit 10b are omitted in FIG. 24 for simplifying the explanation. The MLUTs 30a, 30b shown in FIG. 11 have four number of logic operation address lines A0~A3, four number of logic operation data lines D0~D3, 4×16=64 number of storage elements 40, and an address decoder 9 respectively. The logic operation data lines D0~D3 connect serially 24 number of storage elements 40 respectively. The address decoder 9 is configured to select four number of storage elements which are connected to either 24 number of word lines according to signals entered into the logic operation address lines A0~A3. These four storage elements are respectively connected to the logic operation data lines D0~D3 and output data memorized in the storage element to the logic operation data lines D0~D3. For instance, it may be configured to select four storage elements 40a, 40b, 40c, and 40d in case of appropriate signals entered into the logic operation address lines A0~A3. Here, the storage element 40a is connected to the logic operation data line D0. The storage element 40b is connected to the logic operation data line D1. The storage element 40d is connected to the logic operation data line D2. The storage element 40d is connected to the logic operation data line D3. And, the signals which are memorized in the storage elements 40a~40d are outputted to logic operation data lines D0~D3. Therefore, the MLUTs 30*a*, 30*b* receive logic operation addresses from the logic operation address lines A0~A3 and output as logic operation data, which are values memorized in the four storage elements 40 selected by the address decoder 9 according to the logic operation addresses, to the logic operation data lines D0~D3 respectively. Note that the logic operation address line A2 of the MLUT 30*a* is connected to the logic operation data line D0 of adjacent the MLUT 30*b*. The MLUT 30*a* receives data as the logic operation address output from the MLUT 30*b*. And, the logic operation data line D2 of the MLUT 30*a* is connected to the logic operation address line A0 of the MLUT 30*b*. The MLUT 30*b* receives data as the logic operation address output from the MLUT 30*a*. For instance, the logic operation data line D2 of the MLUT 30*a* outputs a signal, which is memorized in any one of 24 number of storage elements connected to the logic operation data line D2, to the logic operation address A0 of the MLUT 30*b* in accordance with signals entering into the logic operation address lines A0~A3 of MLUT 30*a*. Similarly, the logic operation data line D0 of the MLUT 30*b* outputs a signal, which is memorized in any one of 24 number of storage elements connected to the logic operation data line D0, to the logic operation address A2 of the MLUT 30*a* in accordance with signals entering into the logic operation address lines A0~A3 of the MLUT 30*b*. In this manner, one pair of the address line and the data line is used for connecting the MPLDs with each other. Herein below, the pair of the address line and the data line to be used for connecting the MLUTs, such as the logic operation address line A2 and the logic operation data line D2 of the MLUT 30*a*, will be referred to as "an AD pair".

Note that the number of AD pairs included in the MLUTs 30*a*, 30*b* shown in FIG. 11 is four. However, the number of the AD pairs is not limited to four, as described later.

Figure 12:
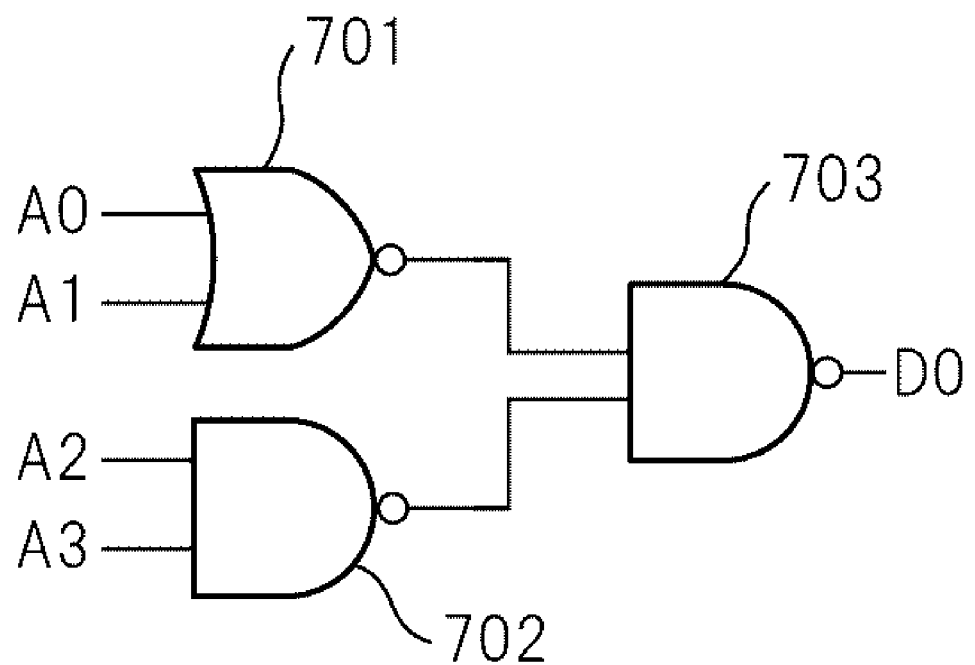
FIG. 12 is a view showing one example of the MLUT which operates as a logic circuit.

FIG. 12 is a view showing one example of the MLUT which operates as a logic circuit. In this example, the logic circuit is configured in the following manner. That is, the logic operation address lines A0 and A1 are inputs of a 2-input NOR circuit 701, and the logic operation address lines A2 and A3 are inputs of a 2-input NAND circuit 702. Further, an output of the 2-input NOR circuit 701 and an output of the 2-input NAND circuit 702 are inputted to a 2-input NAND circuit 703, and an output of the 2-input NAND circuit 703 is outputted to the logic operation data line D0.

FIG. 13 is a view showing a truth table of the logic circuit of FIG. 12. Since the logic circuit of FIG. 12 has four inputs, all inputs from the inputs A0~A3 are used as inputs. On the other hand, since the logic circuit only has one output, only the output D0 is used as an output. In each field for the outputs D1-D3 in the truth table, "*" is described. This means that the value may take either "0" or "1". However, when actually writing in the truth table data into the MLUT for reconfiguration, either one value of "0" or "1" needs to be written into these fields.

B. Connection Element

Figure 14:
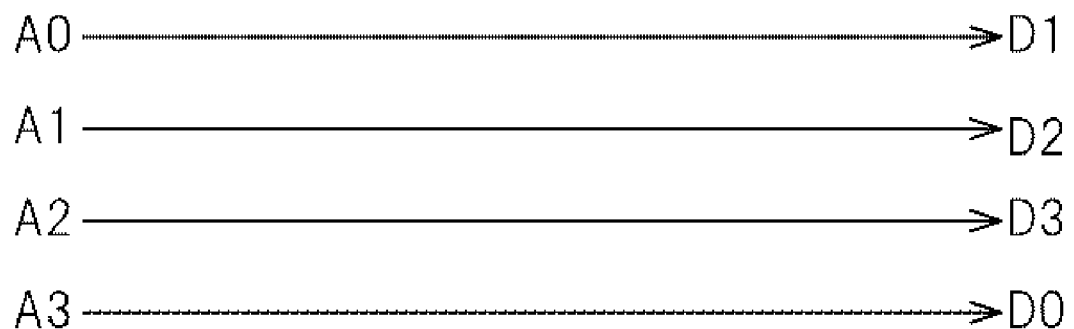
FIG. 14 is a view showing one example of the MLUT which operates as a connection element.

FIG. 14 is a view showing one example of the MLUT which operates as a connection element. In FIG. 14, the MLUT as the connection element operates to output a signal of the logic operation address line A0 to the logic operation data line D1, output a signal of the logic operation address line A1 to the logic operation data line D2, and output a signal of the logic operation address line A2 to the logic operation data line D3. The MLUT as the connection element further operates to output a signal of the logic operation address line A3 to the data line D1.

FIG. 15 is a view showing a truth table of the connection element of FIG. 14. The connection element shown in FIG. 14 has four inputs and four outputs. Accordingly, all inputs from the inputs A0~A3 and all outputs to the outputs D0~D3 are used. The MLUT operates as a connection element which outputs the signal of the input A0 to the output D1, outputs the signal of the input A1 to the output D2, outputs the signal of the input A2 to the output D3, and outputs the signal of the input A3 to the output D0, in accordance with the truth table shown in FIG. 15.

Figure 16:
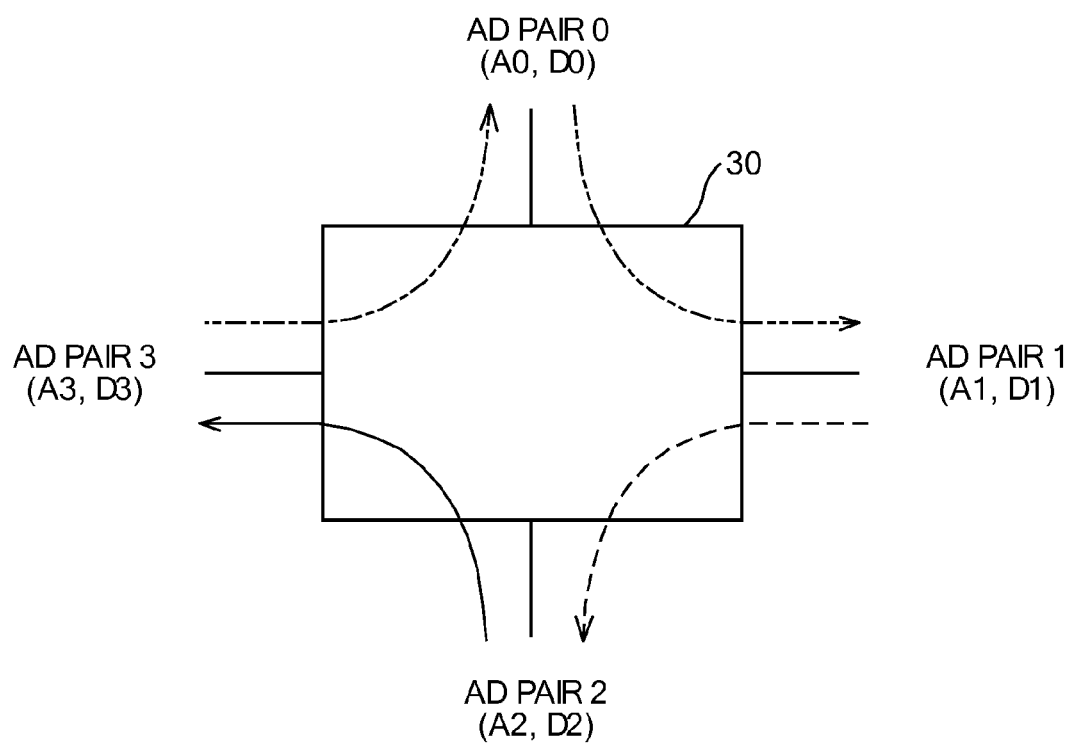
FIG. 16 is a view showing one example of the connection element realized by the MLUT including four AD pairs.

FIG. 16 is a view showing one example of the connection element realized by the MLUT including four AD pairs. AD0 comprises the logic operation address line A0 and the logic operation data line D0. AD1 comprises the logic operation address line A1 and the logic operation data line D1. AD2 comprises the logic operation address line A2 and the logic operation data line D2. And, AD3 comprises the logic operation address line A3 and the logic operation data line D3. A chain line illustrated in FIG. 16, shows signal flow that a signal, which is entered into the logic operation address line A0 of the AD pair 0, is output to the logic operation data line D1 of the AD pair 1. A two-dot chain line illustrated in FIG. 16, shows signal flow that a signal, which is entered into the logic operation address line A1 of the second AD pair 1, is output to the logic operation data line D2 of the AD pair 2. A dash line shows signal flow that a signal, which is entered into the logic operation address line A2 of the AD pair 2, is output to the logic operation data line D3 of the AD pair 3. A solid line shows signal flow that a signal, which is entered into the logic operation address line A3 of the AD pair 3, is output to the logic operation data line D0 of the AD pair 0.

Note that although the MLUT 30 comprises the four number of the AD pairs shown in FIG. 16, the number of the AD pairs is not especially limited the number of four.

C. Combination Function of Logic Element and Connection Element

Figure 17:
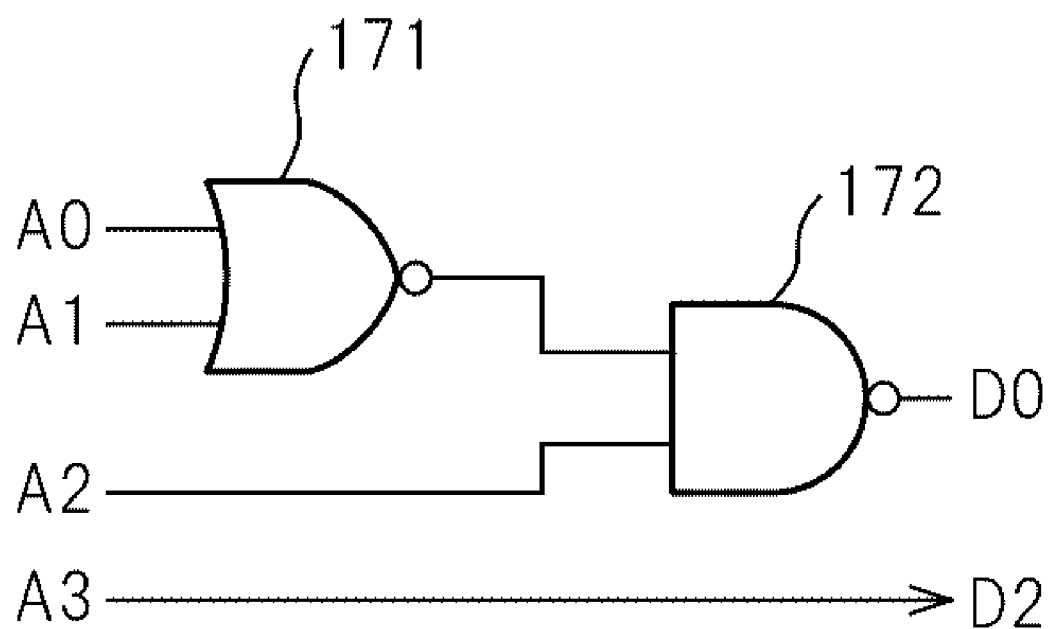
FIG. 17 is a view showing one example of a single MLUT which operates as the logic element and the connection element

FIG. 17 is a view showing one example of a single MLUT which operates as the logic element and the connection element. In the example shown in FIG. 17, the logic circuit is configured in the following manner. That is, the logic operation address lines A0 and A1 are inputs of a 2-input NOR circuit 121, an output of the 2-input NOR circuit 121 and the logic operation address line A2 are inputs of a 2-input NAND circuit 122, and an output of the 2-input NAND circuit 122 is outputted to the data line D0. Further, at the same time, a connection element which outputs the signal of the logic operation address line A3 to the logic operation data line D2 is configured.

FIG. 18 is a view showing a truth table of the logic element and the connection element of FIG. 17. The logic operation of FIG. 17 uses inputs D0~D3 as three inputs, and one output D0 as an output. On the other hand, the connection element of FIG. 18 configures a connection element which outputs the signal of the input A3 to the output D2.

Figure 19:
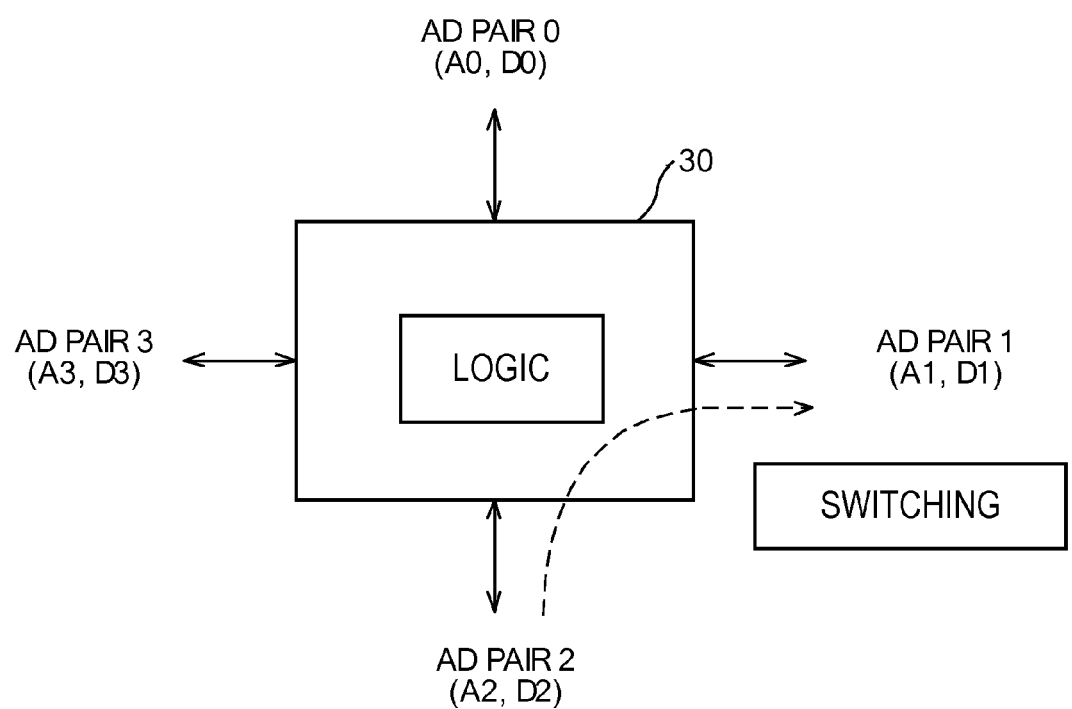
FIG. 19 is a view showing one example of the logic operation and the connection element realized by the MLUT including the AD pairs.

FIG. 19 is a view showing one example of the logic operation and the connection element realized by the MLUT including the AD pairs. Along with the MLUT shown in FIG. 16, AD0 comprises the logic operation address line A0 and the logic operation data line D0. AD1 comprises the logic operation address line A1 and the logic operation data line D1. AD2 comprises the logic operation address line A2 and the logic operation data line D2. And, AD3 comprises the logic operation address line A3 and the logic operation data line D3. As described above, the MLUT 30 realizes two operations of the logic operation (three inputs and one output) and the connection element (one input and one output) by a single MLUT 30. Concretely, the logic operation uses the logic operation address line A0 of the AD pair 0, the logic operation address line A1 of the AD pair 1, and the logic operation address line A2 of the AD pair 2 as the inputs. And, the address line of the logic operation data line D0 of the AD pair 0 is used as the output. Also, the connection element outputs the signal inputted to the logic operation address line A3 of the AD pair 3 to the logic operation data line D2 of the AD pair 2 as shown in a dashed line.

As described above, the MLUT within the MPLD, readily malfunction of extrinsic noise being written in memory cell by the intermediary of the word selection signal because the MLUTs are mutually connected through the intermediary of the plurality of address lines each other. Therefore, the malfunction of extrinsic noise being written can be avoided because the MLUT comprises the ATD circuit so that the writing in memory cell performed only if the address changed.

Although the embodiments of the present invention have been described in detail, it should be understood that the various changes, substitutions, and alterations could be made hereto without departing from the spirit and scope of the invention.

What is claimed is:

1. A semiconductor comprising:
    an address decoder which decodes an address inputted from address lines, and outputs a word selection signal to a word line; and
    a memory cell array including a plurality of non-volatile memory cells, each of which being respectively disposed on crossing over points of each word lines and each data lines, the non-volatile memory cells which include a phase-change layer being partially used as a storage element and being connected to an electrode connected to a power-supply voltage at end;
    a data line voltage control section which writes data on the non-volatile memory cells by decreasing a voltage of the data line being connected to the other end of the phase-change layer and causing partially a phase change in the phase-change layer; and
    a sheet of electrode which provides the power-supply voltage disposed above the phase-change layer,
    wherein the word line, the data line, and the data line voltage control section are disposed under the phase-change layer.

2. The semiconductor device according to claim 1, further comprising a phase-change layer voltage control section applies a voltage which is higher than a reading out voltage to the storage element.

3. The semiconductor device according to claim 1, wherein the non-volatile memory cells include a CMOS inverter sensing an electrical potential read out from the storage element or a MOS transistor accommodating a conductance of the electrical potential.

4. The semiconductor device according to claim 1, wherein the non-volatile memory cells include one n MOS transistor and a MOS transistor accommodating a conductance of the electrical potential read out and being located outside of the memory cell array.

5. The semiconductor device according to claim 1, further comprising a plurality of logic blocks having a plurality of the memory cell arrays respectively, wherein the logic block operates as a logic element or a connection element when a data of a table of truth value being written on the memory cell array.

6. The semiconductor device according to claim 1, wherein the number of the address lines and the data lines are N (N is an integer equal to 2 or more) of them respectively, wherein the N address lines of the logic block are respectively connected to the each data line of N other logic blocks, wherein the N the data lines of the logic block are respectively connected to the each address line of N other storage blocks of the logic block.

* * * * *